(12) United States Patent
Kaveh

(10) Patent No.: US 7,604,449 B1
(45) Date of Patent: Oct. 20, 2009

(54) EQUIPMENT FRONT END MODULE

(75) Inventor: Farrokh Kaveh, Palo Alto, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 550 days.

(21) Appl. No.: 11/167,539

(22) Filed: Jun. 27, 2005

(51) Int. Cl.
H01L 21/677 (2006.01)

(52) U.S. Cl. .................................. 414/411
(58) Field of Classification Search ............ 414/217, 414/935, 411
See application file for complete search history.

(56) References Cited

U.S. PATENT DOCUMENTS

| 5,186,718 | A | * | 2/1993 | Tepman et al. | 29/25.01 |
| 5,217,501 | A | * | 6/1993 | Fuse et al. | 29/25.01 |
| 5,405,230 | A | * | 4/1995 | Ono et al. | 414/217 |
| 5,445,491 | A | * | 8/1995 | Nakagawa et al. | 414/805 |
| 5,474,410 | A | * | 12/1995 | Ozawa et al. | 414/217 |
| 5,570,990 | A | * | 11/1996 | Bonora et al. | 414/543 |
| 5,759,006 | A | * | 6/1998 | Miyamoto et al. | 414/416.01 |
| 5,899,658 | A | | 5/1999 | Hofmeister | 414/744.5 |
| 5,934,856 | A | * | 8/1999 | Asakawa et al. | 414/217 |
| 5,967,740 | A | * | 10/1999 | Pflueger et al. | 414/749.6 |
| 6,042,623 | A | * | 3/2000 | Edwards | 29/25.01 |
| 6,205,881 | B1 | * | 3/2001 | Gravell et al. | 74/483 R |
| 6,234,788 | B1 | * | 5/2001 | Lee | 432/124 |
| 6,409,448 | B1 | * | 6/2002 | Sindledecker | 414/222.04 |
| 6,454,512 | B1 | * | 9/2002 | Weiss | 414/663 |
| 6,468,021 | B1 | * | 10/2002 | Bonora et al. | 414/522 |
| 6,473,996 | B1 | * | 11/2002 | Tokunaga | 34/417 |
| 6,551,049 | B2 | * | 4/2003 | Gravell et al. | 414/539 |
| 6,572,321 | B1 | * | 6/2003 | Nulman | 414/416.05 |
| 6,726,429 | B2 | * | 4/2004 | Sackett et al. | 414/217 |
| 6,817,822 | B2 | * | 11/2004 | Tokunaga | 414/217 |
| 6,981,832 | B2 | * | 1/2006 | Zinger et al. | 414/217 |
| 7,066,707 | B1 | * | 6/2006 | Bonora et al. | 414/744.3 |
| 7,100,340 | B2 | * | 9/2006 | Bonora et al. | 52/729.5 |
| 7,101,138 | B2 | * | 9/2006 | Fosnight et al. | 414/222.11 |
| 7,246,985 | B2 | * | 7/2007 | Ferrara | 414/217 |
| 2001/0043849 | A1 | * | 11/2001 | Perlov et al. | 414/222.01 |
| 2001/0053324 | A1 | * | 12/2001 | Saeki et al. | 414/936 |
| 2003/0113190 | A1 | * | 6/2003 | Bachrach | 414/217 |
| 2005/0079041 | A1 | * | 4/2005 | Campbell et al. | 414/626 |

(Continued)

OTHER PUBLICATIONS

Brooks Automation, Inc.—Reliance ATR. Retrieved on Jun. 23, 2005. Retrieved from the Internet <http://www.brooks.com/pages/105_reliance_atr.cfm>.

(Continued)

Primary Examiner—Charles A Fox
(74) Attorney, Agent, or Firm—Joshua D. Isenberg; JDI Patent

(57) ABSTRACT

Equipment front end module (EFEM) systems and methods for handling workpieces at EFEMs are disclosed. An equipment front end module (EFEM) system has an enclosure and a robot within the enclosure. The enclosure has two or more load ports, each being adapted to receive a front opening unified pod (FOUP). The robot is configured to move work pieces between the FOUP(s) and one or more work piece processing tools proximate the enclosure. The load ports are positioned relative to said robot such that said robot can move the work pieces between the tool and a FOUP at each load port with a simple R-theta motion or pure linear motion with respect to two axes.

25 Claims, 10 Drawing Sheets

U.S. PATENT DOCUMENTS

| | | | |
|---|---|---|---|
| 2006/0045663 A1* | 3/2006 | Aggarwal et al. | 414/217 |
| 2006/0056952 A1* | 3/2006 | Haris | 414/744.6 |
| 2007/0081879 A1* | 4/2007 | Bonora et al. | 414/217 |
| 2007/0269302 A1* | 11/2007 | Kim et al. | 414/744.1 |
| 2008/0025824 A1* | 1/2008 | Hashimoto | 414/217.1 |

OTHER PUBLICATIONS

Data Sheet for Motoman HS & HM Series Robots. Sep. 2002. Retrieved from the Internet <http://www.motoman.com/products/datasheets/SCARA.pdf> Retrieved on Jun. 23, 2005.

Clean Manipulators—Kawasaki Robot. Retrieved on Jun. 23, 2005. Retrieved from the Internet <http://www.khi.co.jp/robot/e/shouhin/shouhin5.html>.

Kawasaki Robot—Clean Robot, Kawasaki Heavy Industries. Retrieved on Jun. 23, 2005. Retrieved from the Internet <http://www.khi.co.jp/robot/e/shouhin/pdf/cleanrobot-e.pdf>.

Final Office Action for U.S. Appl. No. 10/910,110 dated Feb. 3, 2009, 7 pages.

Notice of Allowance and Fee(s) Due dated Apr. 21, 2009 for U.S. Appl. No. 10/910,110.

* cited by examiner

EQUIPMENT FRONT END MODULE

CROSS-REFERENCE TO RELATED APPLICATION

This Application is related to commonly-assigned co-pending application Ser. No. 10/910,110, filed Jul. 29, 2004.

FIELD OF THE INVENTION

This invention generally relates to substrate processing and more particularly to equipment front end modules (EFEMs) used in substrate processing systems.

BACKGROUND OF THE INVENTION

Modern semiconductor fabrication facilities (known as "fabs") use tools that can process multiple wafers. The wafers are typically delivered to a tool from a stocker in a front opening unified pod (FOUP). The FOUPS may be hand carried to and from the tool or they may be delivered by an automated material handling system (AHMS) or overhead track (OHT) system. Wafers are transferred from the FOUPs to the tool through an equipment front end module (EFEM). The EFEM typically includes one or more load ports (LPs) and robot arm that takes the wafers from a FOUP at a given load port and delivers them to the tool. Initially, EFEMs had only one LP and the robot could handle the wafer with a very simple motion, in some cases, just a simple linear motion of the robot arm. Later EFEMs had two, then three, then four LPs arranged side by side horizontally. The side by side arrangement of the LPs required a complex motion of the robot arm in order to handle wafers at each LP. A simple combination of rotation about a vertical axis and translation perpendicular to the axis (sometimes referred to as R-theta motion) is not sufficient.

For example, FIG. 13A shows a typical R-theta robot 1300 having a mechanical arm mounted to a turntable 1302A. The mechanical arm includes a first link 1304A coupled to a second link 1306A by a motor 1308A. An end effector 1310A is coupled to the second link 1306A. Rotation of the turntable 1302A and the motor 1308A provides movement to the links 1304A, 1306A and end effector 1310A. A system of gears and pulleys restricts arm movement to three degrees of freedom: R (radial from center axis of the robot), theta (rotation) and (optionally) Z (translation along the center axis). The end effector 1310A is constrained by the mechanical system to always point away from the center axis of the turntable 1302A. If the LPs are arranged side-by-side, an extra degree of movement is required, in order to access the wafers orthogonal to the FOUP opening. The extra degree of movement can be supplied, e.g., by moving an R-theta robot along a track parallel to the front wall of the EFEM or by adding an extra degree of movement so that the end effector can move independent of the arm position.

For example, FIG. 13B shows a robot 1300B having a mechanical arm mounted to a turntable 1302B. The mechanical arm includes a first link 1304B coupled to a second link 1306B by a first motor 1308A. An end effector 1310B is coupled to the second link 1306B by a second motor 1309. Rotation of the turntable 1302B and the motors 1308B, 1309 provides independent movement to the links 1304B, 1306B and end effector 1310B. The robot 1300B has four degrees of freedom $\theta_1$, $\theta_2$, and $\theta_3$ and (optionally) Z. The links 1304B, 1306B and the end effector 1310B can move independently of each other and the end effector 1310B is free to point in any direction relative to the axis of the turntable 1302B. The extra degree of movement makes the robot complex in terms of both mechanical design and motion control hardware and software. This complexity can account for as much as 30% of the cost of an equipment front end module.

Thus, there is a need in the art, for an equipment front end module that overcomes the above disadvantages.

SUMMARY OF THE INVENTION

The disadvantages associated with the prior art are overcome by embodiments of the present invention directed to equipment front end module (EFEM) systems and methods for handling workpieces at EFEMS.

According to an embodiment of the invention, an equipment front end module (EFEM) system having an enclosure and a robot within the enclosure. The enclosure has two or more load ports, each being adapted to receive a front opening unified pod (FOUP). The robot is configured to move work pieces between the FOUP(s) and one or more work piece processing tools proximate the enclosure. The load ports are positioned relative to said robot such that said robot can move the work pieces between the tool and a FOUP at each load port with a simple R-theta motion or pure linear motion with respect to two axes.

With such an EFEM system, work pieces may be handled by receiving a FOUP at any of the load ports and moving the work piece in a simple R-theta motion between the FOUP and a work piece processing tool.

Embodiments of the present invention allow for more compact, less expensive, more reliable and more efficient EFEMs.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
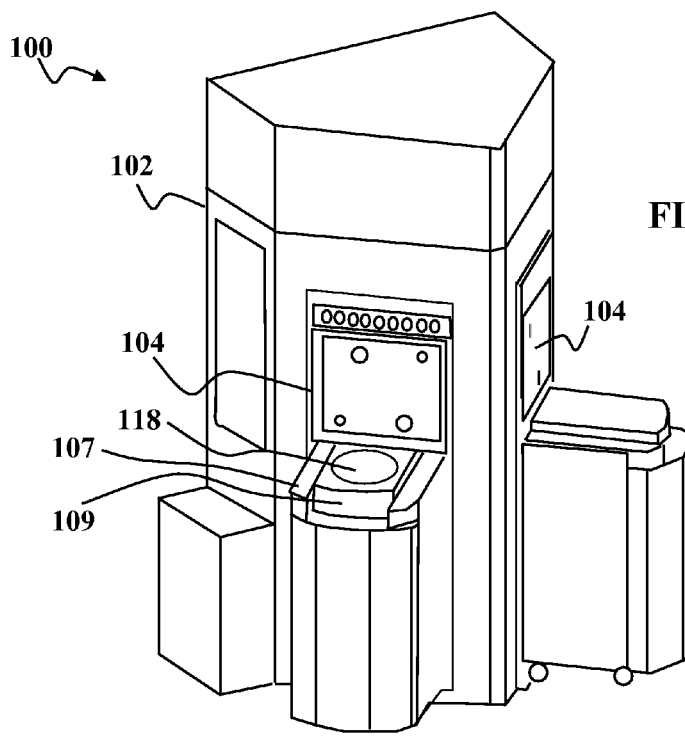
FIG. 1A is a three dimensional diagram of an EFEM system according to an embodiment of the present invention.
Figure 1B:
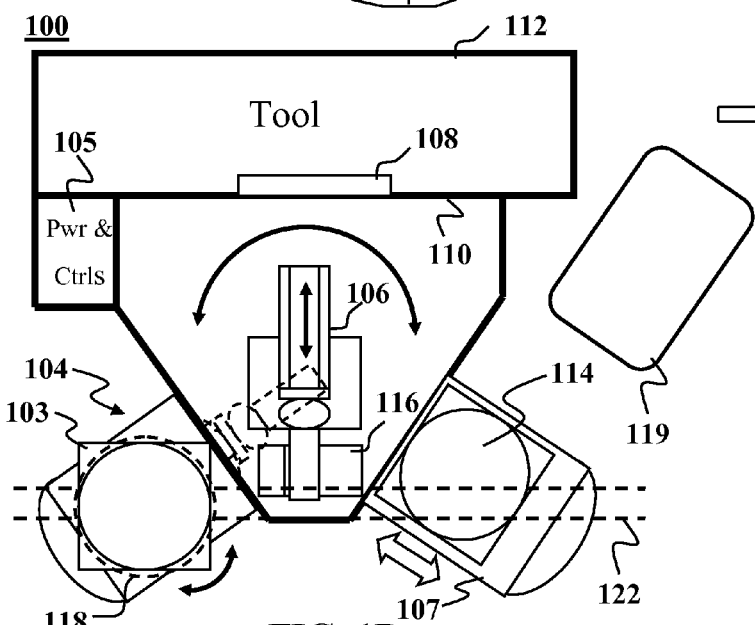
FIG. 1B is a plan view schematic diagram of the EFEM system of FIG. 1.

FIGS. 1A-1B depict an example of an EFEM system 100 according to an embodiment of the present invention. The system 100 generally includes an enclosure 102 having one or more front side walls. Two or more load ports 104 are built into the side walls. Each load port is conventionally configured to receive a front opening unified pod (FOUP) 103. For example, the load ports 104 may include a loading mechanism 107 having a moving shelf 109 that translates a FOUP toward or away from a door in the side wall. The load ports 104 are not arranged side-by-side, as in conventional EFEM systems. Instead, the side walls of the enclosure 102 are configured such that the load ports are angled inwardly with respect to each other. This inward angling of the load ports facilitates access to the load ports by a robot 106 within the enclosure 102. The load ports 104 and robot 106 may operate under power and programming supplied by a power and control unit 105.

A port 108 in a rear wall 110 of the enclosure 102 allows access to a tool 112 that processes workpieces 114. The robot 106 then returns the processed workpieces to the FOUP 103 or to a different FOUP at a different load port. The FOUPs 103 transfer the workpieces 114 between the EFEM system 100 and other systems within a processing facility. By way of example, the workpieces 114 may be semiconductor wafers and the tool 112 may be a wafer processing tool. Embodiments of the present invention are particularly applicable to tools that have a high throughput of wafer pods. Examples of such tools include metrology tools. This is particularly important during tool qualification. This can occur on a process change, no recipe or shift change. Example tools would be SP1, SP2, (wafer surface inspection) and F5X (thin film metrology) from KLA Tencor of Milpitas, Calif.

The advantages of angling the load ports 104 are illustrated in FIG. 1B. The angling of the load ports 104 allows the robot 106 to transfer workpieces between the tool and FOUPs at the load ports or vice versa using a simple R-theta motion. As used herein, the term R-theta motion refers to a motion involving a combination of rotation of the robot, or a portion thereof, about a single fixed axis (theta-motion) and translation of the robot (or portion thereof) in a direction having a component perpendicular to the single fixed axis (R-motion).

There are a number of different types of commercially available robots that can carry out such simple R-theta motion. These robots, referred to herein as R-theta robots, include "frog-leg" style robots commonly used in cluster tools and selective compliant assembly robot arm (SCARA)-type robots or linear arm robots as depicted in FIG. 1B. Examples of suitable frog-leg type robots are described in U.S. Pat. No. 5,899,658, which is incorporated herein by reference. Examples of suitable SCARA-type robots include the Reliance ATR™ model available from Brooks Automation Inc. of Chelmsford Mass. and HM series and HS series robots from Motoman, Inc. of West Carrollton, Ohio and NS series robots from Kawasaki Heavy Industries Limited of Akashi, Japan. The system 100 may optionally include a pre-aligner 116 to align the work pieces 114 with an end-effector of the robot 106 to ensure proper alignment of the work pieces 114 when they are placed in the tool 112.

Figure 14:
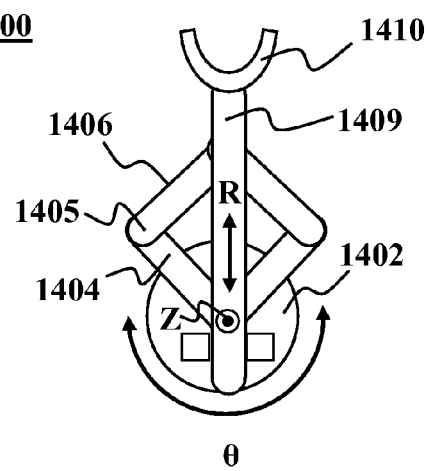
FIG. 14 is a schematic diagram of a "frog-leg" type robot.

By way of example, and without loss of generality, FIG. 14 depicts a "frog-leg type robot 1400, which has two linked arms driven by separate motors mounted to a base 1402. Each arm includes first and second links 1404, 1406 that are linked to pivot at their joint 1405 and at a common axis Z. Each arm is pivotally linked to a linear arm 1409 having an end effector 1410. The linear arm 1409 is constrained to move radially in the direction indicated by R. Separate motors at the Z axis drive rotation of each arm. When the two arms are driven in the same direction, the linear arm 1409 rotates about the Z axis. When the two arms are driven in opposite directions the arm moves in the radial direction R.

Figure 1C:
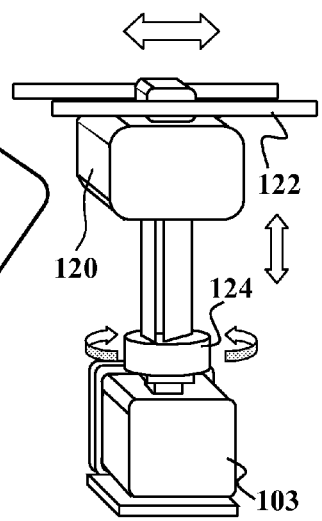
FIG. 1C is a three-dimensional schematic diagram of an overhead track system adapted for use with embodiments of the present invention.

Certain embodiments of the present invention are useful in manufacturing environments in which an automated material handling system (AHMS) may deliver the FOUPs to the EFEM and retrieve finished FOUPs from the EFEM. By way of example, the AHMS may include an automatic guided vehicle (AGV) 119 or overhead track (OHT) system. In such a case, it is often desirable to modify either the load port mechanism or the AHMS to accommodate the angling of the load ports. For example, one of the reasons that prior art EFEMs had side-by-side load ports was so that the OHT system could access all of the load ports. If the load ports are angled, however, the FOUPs must be able to turn from alignment with the OHT system to alignment with the load port 104. The load mechanisms of each load port 104 allow enough horizontal translation that an OHT system having a car and rails 122 (shown in phantom in FIG. 1B) can deliver and retrieve the FOUPs without hitting the walls of the enclosure. According to embodiments of the invention, the load mechanism may include a turntable 118 that rotates a FOUP from the position aligned with the OHT system to a position in which the FOUP is aligned with the load port 104. Alternatively, the turning capability may be built into the AMHS. For example, as shown in FIG. 1C, an OHT car 120 running on rails 122 may raise and lower a FOUP 103. The OHT car 120 may further include a pivoting mechanism 124 that turns the FOUP 103 in a horizontal plane to align it with the load port 104.

Figure 2:
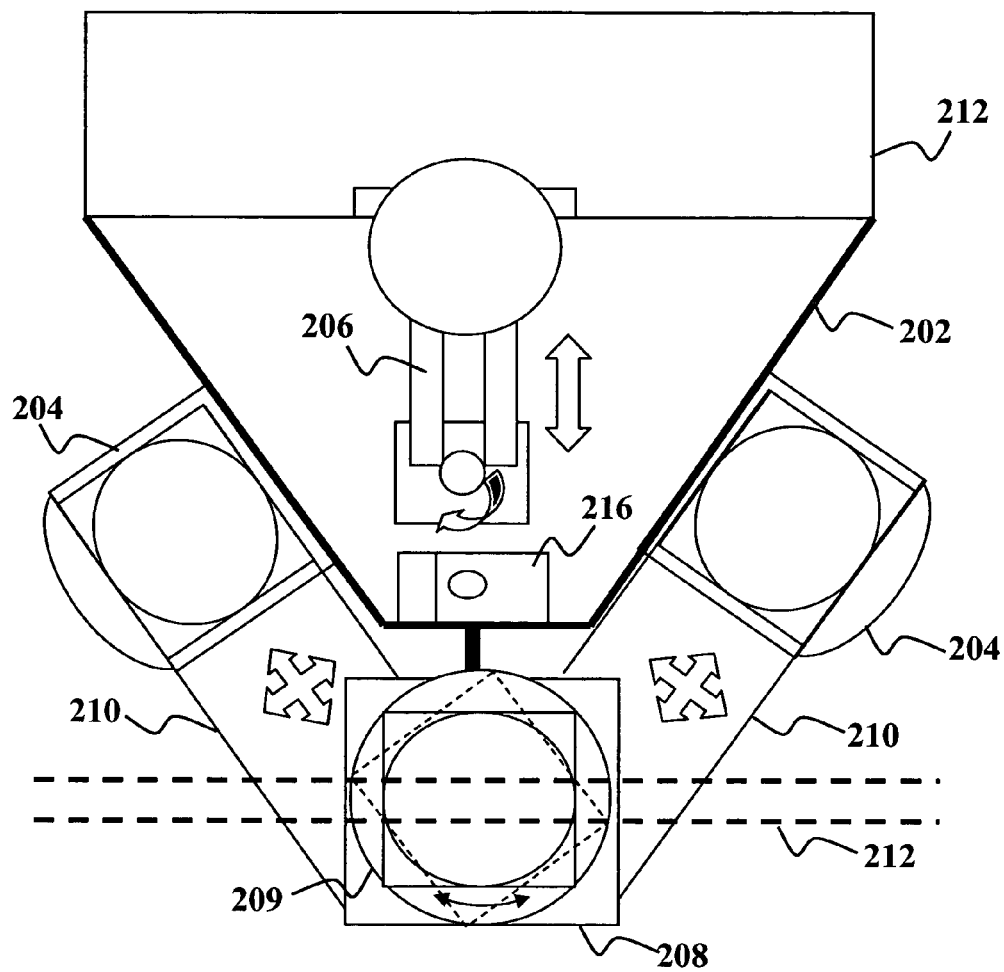
FIG. 2 is a plan view schematic diagram of a dual port EFEM system according to an embodiment of the present invention.

There are many variations possible on the system 100 described above. For example, in certain embodiments, it is desirable to temporarily store FOUPs at an EFEM either before processing of the workpieces can begin or after processing has been completed. Such a storage capability can allow more efficient use of the tool and AMHS if it does use the AMHS to move the FOUPs from temporary storage to the load ports. For example, FIG. 2 depicts an alternative EFEM system 200 similar to that depicted in FIGS. 1A-1B. The system 200 includes an enclosure 202, load ports 204 and an R-theta robot 206 that can transfer work pieces between FOUPs 203 and a tool 212 as described above. The system 200 includes a storage location 208, transfer units 210 and an optional pre-aligner 216. Each transfer unit 210 is configured to receive a FOUP 203 from the automated material handling system at the storage location 208 and move the FOUP 203 to one or more of the load ports 204. Each transfer unit 210 may be additionally or alternatively configured to receive a FOUP from one or more of the one or more load ports 204 and move the FOUP to the storage location 208. The transfer units 210 may be configured to move the pod by translating the FOUP.

In the embodiment depicted in FIG. 2, the transfer units 210 may each include a translating mechanism configured to translate the FOUPs 203 horizontally between a load port 204, and a single storage location 208 located between the two load ports 204. Such a translating mechanism may be implemented by a simple conveyor belt, track mechanism or a motorized cart running on tracks. The position of the storage location 208 allows an OHT system 220 (shown in phantom) to deliver/receive FOUPs to/from either port 204. As discussed above, it is desirable to be able to turn the FOUP so that it can align with the OHT system 220 or either load port. Such a turning capability may be built into the transfer units 210, the storage location 208 (e.g., in the form of a turntable 209), or the load ports 204 e.g., in the form of a turntable. Alternatively, the turning capability may be built into the OHT system 220 as described above with respect to FIG. 1C.

Figure 3:
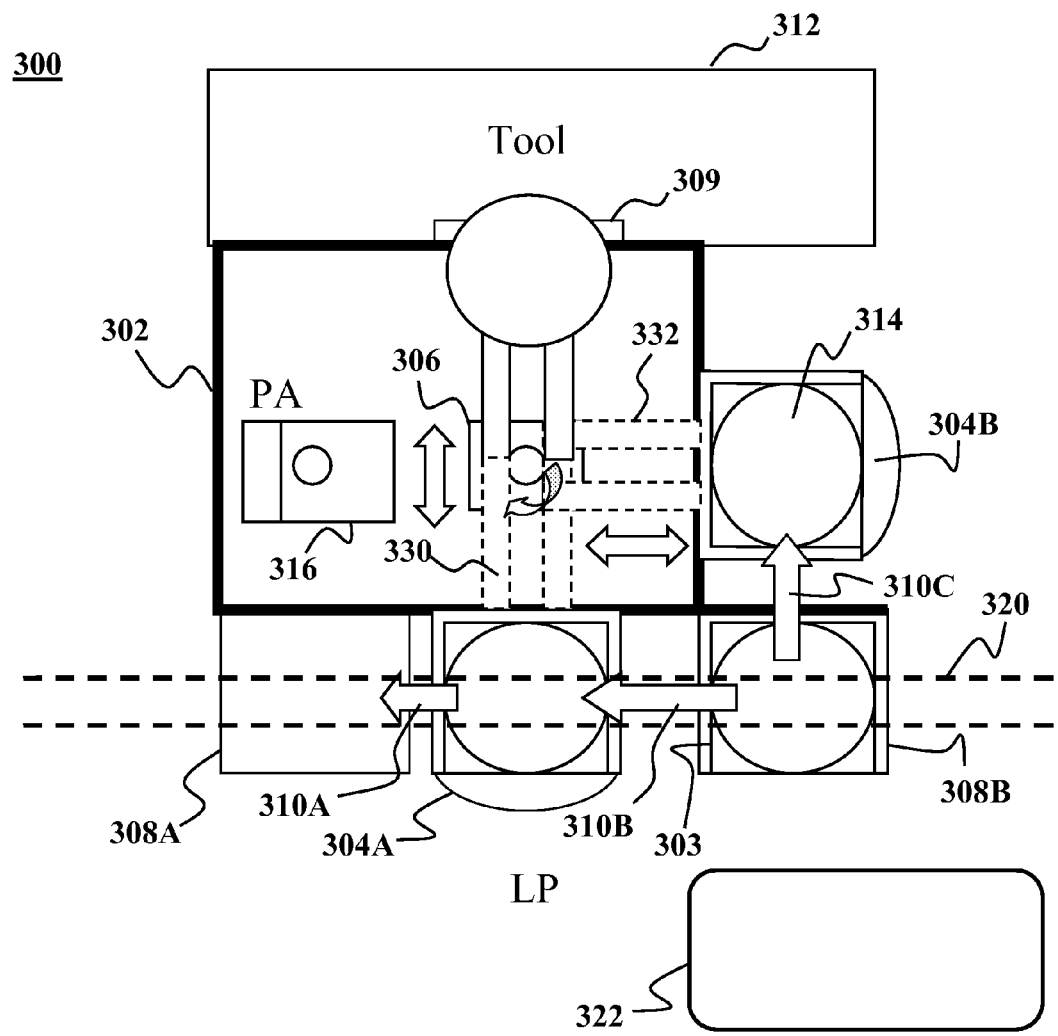
FIG. 3 is a plan view schematic diagram of an alternative dual-port EFEM system according to an embodiment of the present invention.

FIG. 3 depicts an EFEM system 300 that is a variation on the systems described above. The system 300 generally includes a rectangular enclosure 302 having first and second load ports 304A, 304B at two walls that are orthogonal to each other. As discussed above, the load ports 304A, 304B and a tool 312 can be accessed by an R-theta robot 306. In the example depicted in FIG. 3, the R-theta robot may have a single rail mounted to a turntable. A robotic vehicle with an end effector runs along the rail. Alternatively, workpieces 314 may be transferred from FOUPS 303 at the load ports 304A, 304B and the tool 312 (or vice versa) by a pure linear robot.

In the example depicted in FIG. 3, the linear robot may have two pairs of fixed rails 330, 332 (shown in phantom) that are oriented at right angles to each other. A robotic vehicle carries the workpieces 303 on the rails. To transfer a workpiece to the tool 312 from a FOUP at load port 304A, the vehicle travels first along rails 330 through the intersection of the two rails 330, 332 and then on to an access port 309 of the tool 312. To transfer a workpiece to the tool 312 from a FOUP at load port 304B, the vehicle travels first along rails 332 to the intersection of the two rails 330, 332 and then along rails 330 to an access port 309 of the tool 312. Although rails 330, 332 are shown as being perpendicular to each other, they may alternatively be arranged non-perpendicular to each other.

The system 300 may further include optional storage shelves 308A, 308B on either side of the first load port 304A with the second storage shelf 308B being located at a corner of the enclosure 302 between the first and second load ports 304A, 304B. FOUPs can be stored at the storage shelves 308A, 308B while awaiting processing by the tool or transfer to other tools or storage within a fab. First and second transfer mechanisms 310A, 310B may move FOUPs 303 between the first load port 304A and the storage shelves 308A, 308B or vice versa. A third transfer mechanism 310C may move FOUPs between the second load port 304B and the storage shelf 308B. With this configuration two storage shelves 308A, 308B and one load port 304A can be aligned with an OHT system 320. In some embodiments, the transfer mechanisms may be implemented by conveyor belts, tracks or motorized carts as described above. Alternatively, the transfer of the FOUPs may be implemented by the OHT system 320, an AGV 322 or a (human) operator. The load ports 304A, 304B, storage shelves 308A, 308B, 308C or transfer mechanisms 310A, 310B may include a mechanism for turning the FOUPs if necessary for proper alignment with respect to the robot 306. Alternatively, this capability can be built into the OHT system 320.

Figure 4:
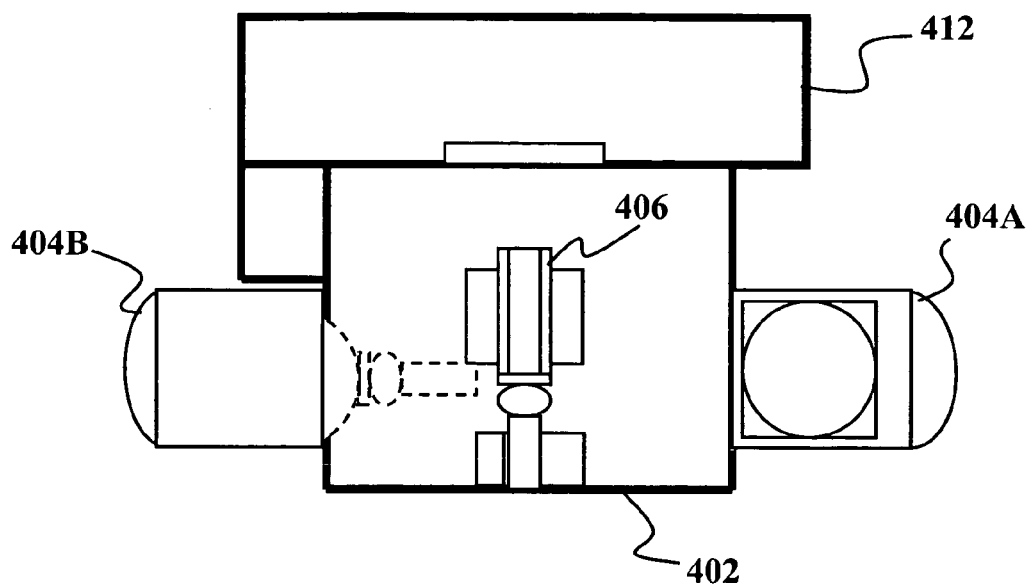
FIG. 4 is a plan view schematic diagram of another alternative dual-port EFEM system according to an embodiment of the present invention.
Figure 5:
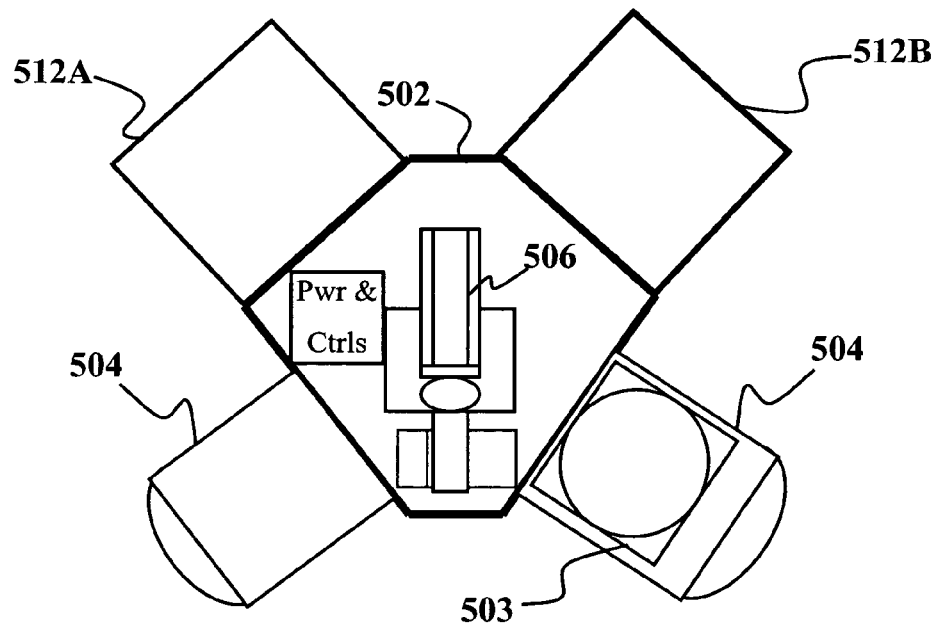
FIG. 5 is a plan view schematic diagram of dual-port, dual-tool EFEM system according to an embodiment of the present invention.

Additional embodiments of the present invention are shown in FIG. 4 and FIG. 5. FIG. 4 depicts an EFEM system 400 having a rectangular enclosure 402 with load ports 404A, 404B located at opposite walls. An R-theta robot can access workpieces from FOUPs 403 at either load port and deliver them to or retrieve them from a tool 412. Embodiments of the present invention also allow a single EFEM system to handle two or more different tools. For example FIG. 5 depicts an EFEM system 500 having an enclosure 502 with a rear wall made of two or more angled sections and a front wall with two or more angled sections. Load ports 504 are located at the angled sections of the front wall and tools 512A, 512B are located at the angled sections of the rear wall. The load ports and tools are angled such that an R-theta robot 506 can transfer workpieces from FOUPs 503 located at either load port 504 to either tool 512A, 512B.

Although much of the preceding discussion deals with R-theta robots, those of skill in the art will recognize that embodiments of the present invention can use robots that move in a purely linear fashion along two axes. For example, as discussed above with respect to FIG. 3, conventional X-Y translation robots that move in a pure linear fashion can also be adapted for use, e.g., in the system 400 of FIG. 4 or the system 500 of FIG. 5 to transfer workpieces between a FOUP and a tool or vice versa.

Figure 6:
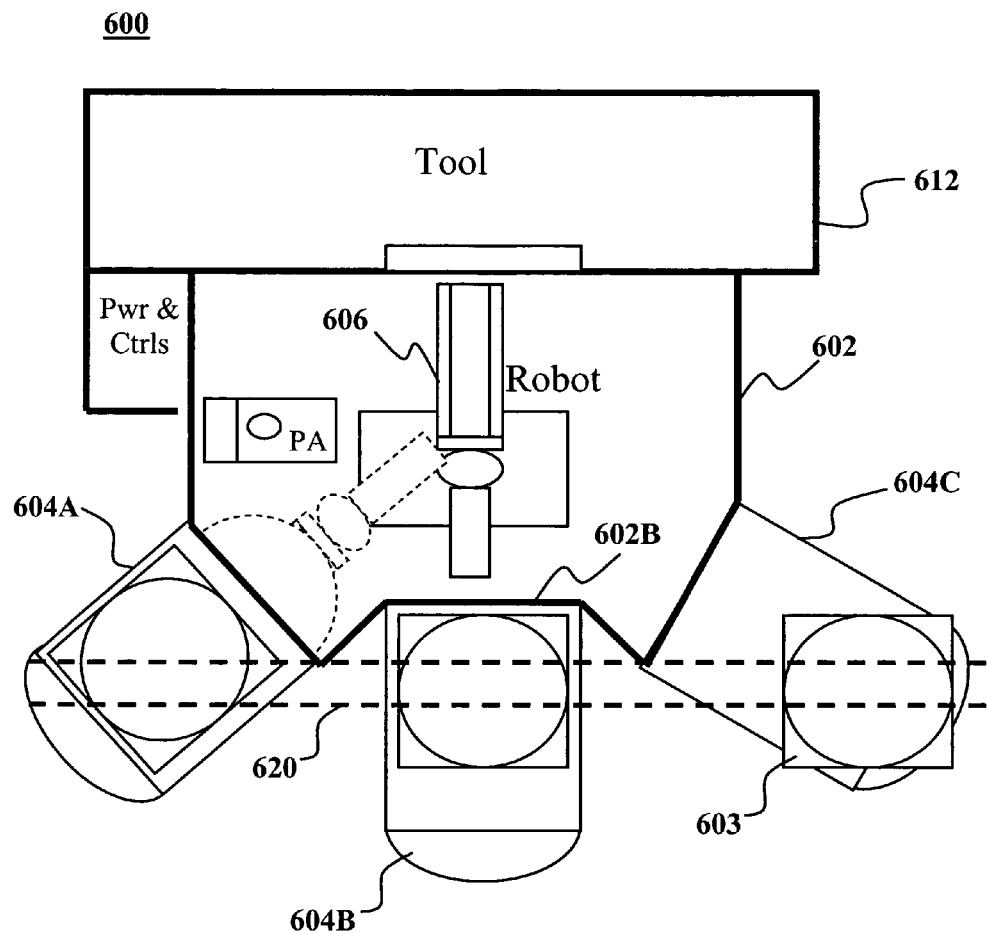
FIG. 6 is a plan view schematic diagram of a three-port EFEM system according to an embodiment of the present invention.

Embodiments of the present invention may also be extended to EFEM systems having three or more load ports. For example, FIG. 6 depicts an EFEM system 600 having an enclosure 602 adapted for use with three load ports 604A, 604B, 604C and an R-theta robot 606. A tool 612 may be accessed via a port in a rear wall of the enclosure 602. The enclosure 602 has a front wall with an indented central section 602B. The indented central section 602B allows load ports of a standard design to be aligned such that a single OHT system 620 to deliver FOUPs 603 to each of the load ports 604A, 604B, 604C. The load ports 604A, 604B, 604C may include mechanisms for turning the FOUPs 603 if necessary to align them with corresponding doors in the enclosure 602. Alternatively, this capability can be built into the OHT system 620.

Figure 7:
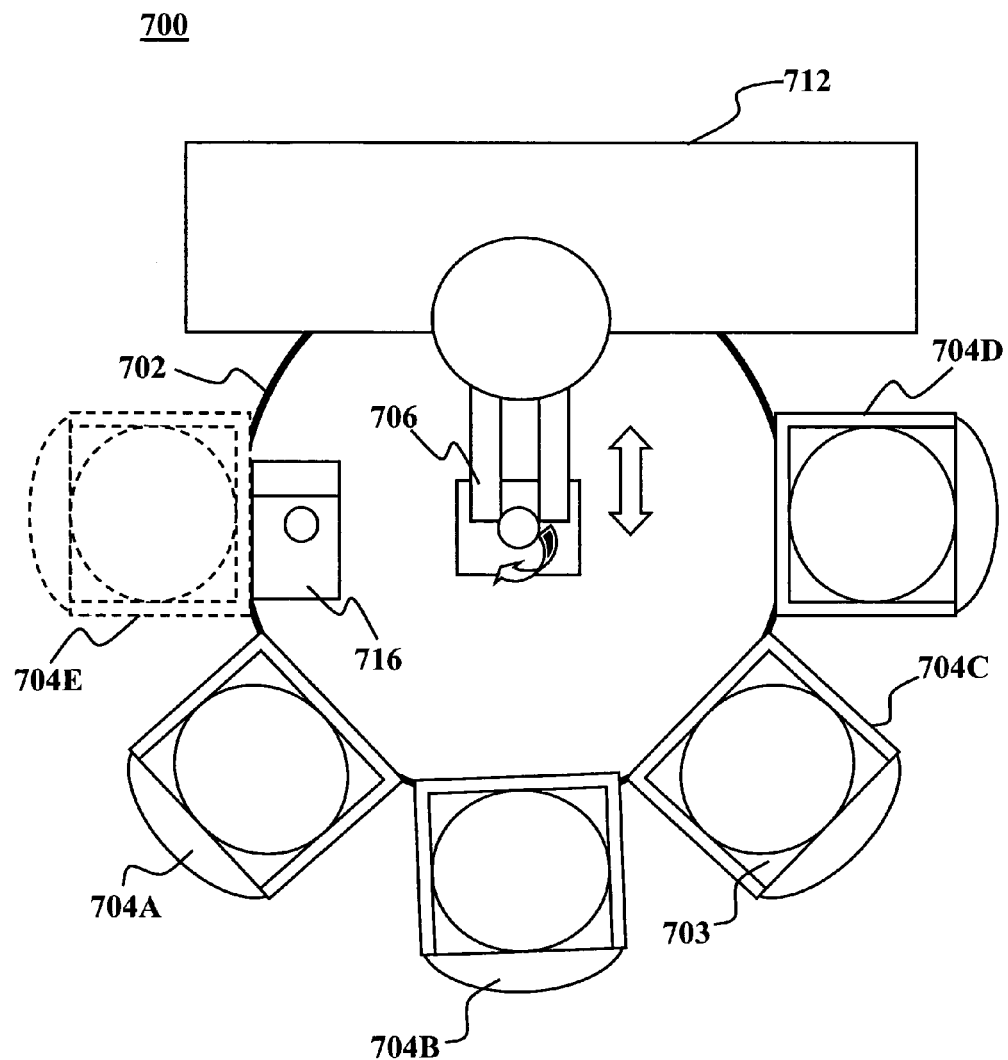
FIG. 7 is a plan view schematic diagram of a four-port EFEM system according to an embodiment of the present invention.

Embodiments of the present invention can be extended to EFEM systems having any number of load ports. For example, FIG. 7 depicts an EFEM system 700 having an enclosure 702 with a cylindrical wall adapted to receive four load ports 704A, 704B, 704C, and 704D arranged similar to the spokes of a wheel. Depending on the number of ports, the enclosure 702 may be a circular cylinder or a cylindrical polyhedron, e.g., having, 5, 6, 7, 8, 9, 10 or more vertical sides, with a load port at each side. This configuration allows an R-theta robot to access all four load ports and a tool 712 using simple R-theta motion. In this case, an optional pre-aligner unit 716 takes up space that would otherwise be available for a fifth load port 704E (shown in phantom). Those of skill in the art will recognize that the system 700 can be modified to handle five or more load ports, e.g., by dispensing with the pre-aligner 716 or by using a larger diameter enclosure, provided the robot 706 has a sufficient range of motion.

Figure 8:
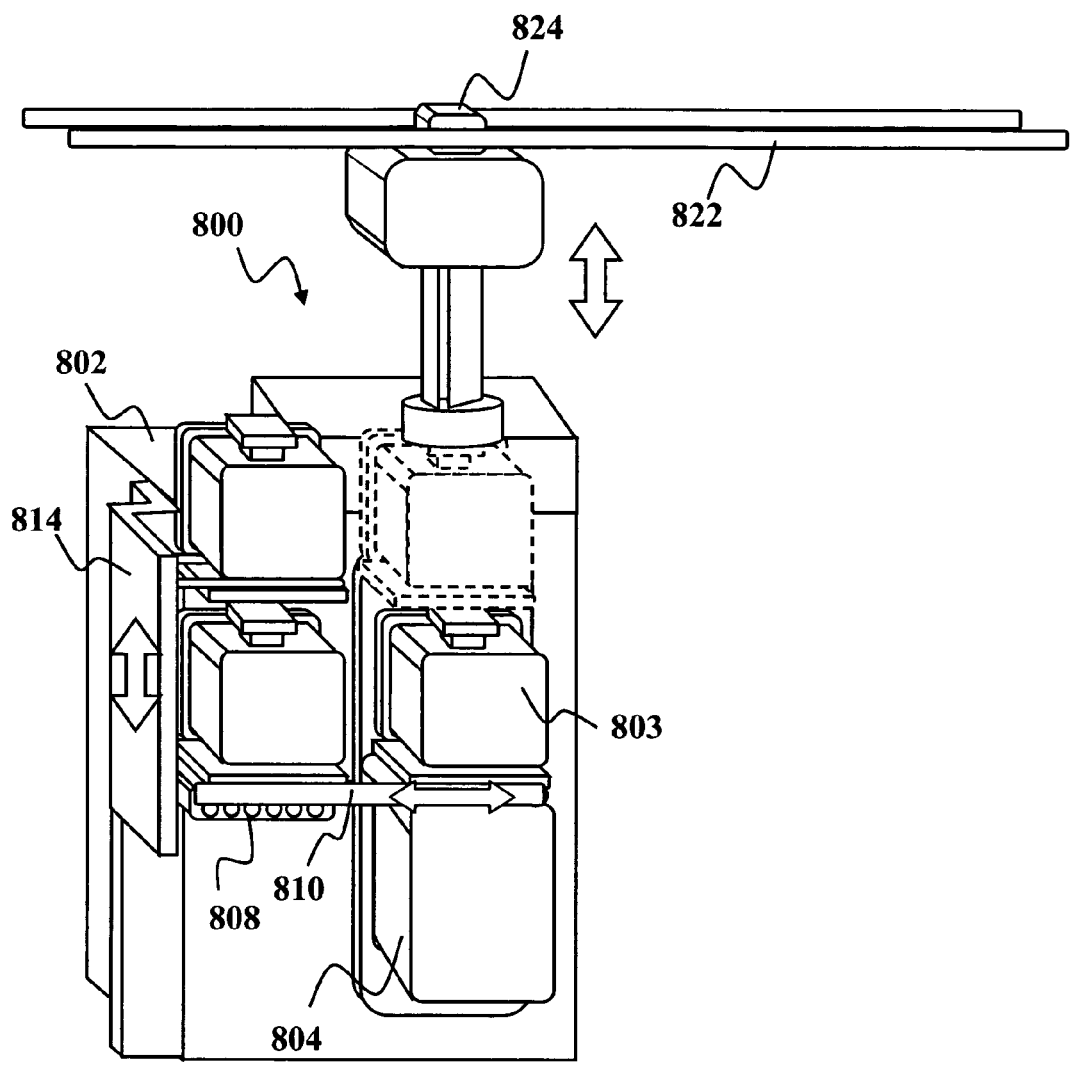
FIG. 8 is a three-dimensional schematic diagram of a part of an EFEM system according to an alternative embodiment of the present invention.

Numerous variations are possible on the embodiments discussed above. For example, there are several different designs for the transfer mechanisms used to move FOUPs between a storage location and a load port, e.g., as discussed with respect to FIGS. 2, 3 and 6. For example, although transfer mechanisms that horizontally translate FOUPs have been described, other transfer mechanisms may be used. Other types of transfer mechanisms may be used in conjunction with such embodiments. FIG. 8 depicts a portion of an EFEM system 800 that having transfer mechanisms that can vertically translate FOUPs. The system 800 may be used e.g., in conjunction with embodiments of the invention described above. In the system 800 horizontal transfer mechanisms 810 and vertical transfer mechanisms 814 are located proximate one or more load ports at a front end of an enclosure 802. For the sake of simplicity of illustration, only a single load port, horizontal transfer mechanism and vertical transfer mechanism are depicted. However, those of skill in the art will recognize that these components may be incorporated into EFEM systems having multiple load ports as described in the various embodiments discussed above.

The horizontal transfer mechanisms 810 (e.g., tracks, conveyor belts or carts) move FOUPs 803 between storage locations 808 and load ports 804. Any FOUP 803 on the transfer mechanisms 810, or at one of locations 808, may be accessible either manually or by the material handling system. The vertical transfer mechanisms 814 may be in the form of lifts that can translate a FOUP vertically. By way of example, the lift 814 may be a fork-lift type mechanism as depicted in FIG. 8, or an overhead lift, having a lift mechanism similar to that of an OHT car. The lift 814 provides the system 800 with the ability to store two FOUPs 803 at the storage location 808, thereby increasing the number of pods the system 800 can handle while still reducing the usage of the materials handling system, e.g., cars 824 on an overhead track 822. The vertical lift 814 also allows the horizontal transfer mechanism 810 to free the storage locations 808, for finished FOUPs if a tool served by the EFEM system 800 completes an additional FOUP before the first completed FOUP can be collected.

Figure 9:
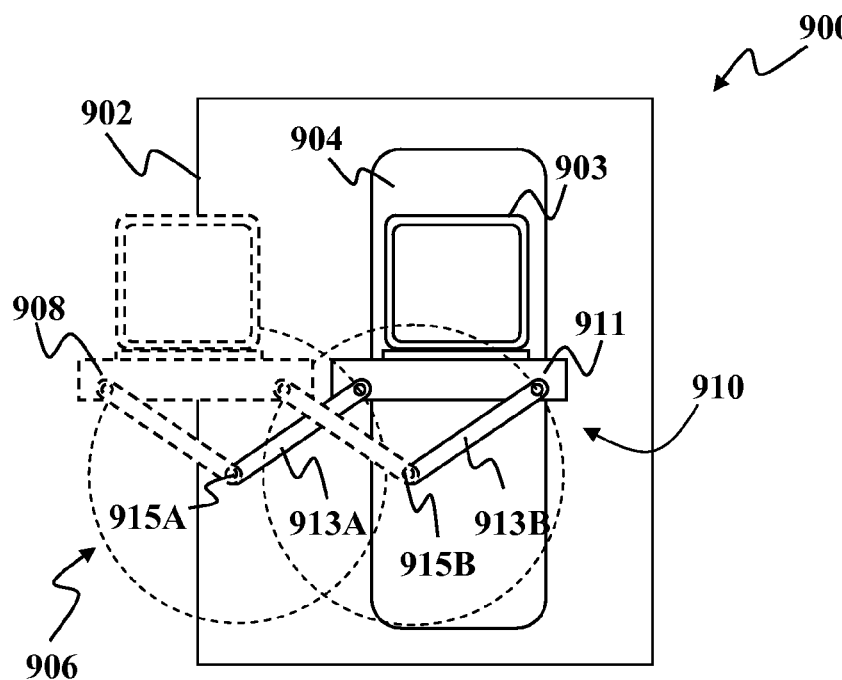
FIG. 9 is a front elevation schematic of an EFEM system with a rotating transfer mechanism according to an embodiment of the invention.

In certain situations, it is desirable to impart a rotational movement to a FOUP while maintaining the FOUP in a substantially level orientation. This is particularly true where the rotational motion includes a substantially vertical component. According to an alternative embodiment of the invention the transfer mechanism may be configured to maintain the pod in a substantially level orientation during the rotational motion. For example, FIG. 9 depicts an EFEM system 900 with a rotating transfer mechanism 910 proximate an enclosure 902. For the sake of simplicity, a single load port 904 and transfer mechanism 910 are depicted. However, the concept may be extended to systems having two or more load ports configured as discussed above. The transfer mechanism 910 includes a pod carrier 911 and two or more pivot arms 913A, 913B. The pivot arms 913A, 913B are pivotally attached at one end to the pod carrier 911 and pivotally attached to pivot points 915A, 915B at another end. The pivot points 915A, 915B are in a substantially fixed position with respect to the load port 904. For the sake of simplicity only two pivot arms are shown. Practical implementations may employ two parallel pairs of pivot arms arranged on opposite sides of the pod carrier 911. The pivot arms 913A, 913B, pod carrier 911 and pivot points 915A, 915B are arranged such that the pivot arms remain substantially parallel to each other as they rotate. Specifically, at some orientation, the points of pivotal attachment (i.e., then pivot points 915A, 915B and the points where the pivot arms 913A, 913B pivotally attach to the pod carrier 911) are at the corners of a parallelogram. When the pivot arms rotate in tandem the pod carrier 911 keeps the pod level while moving from the load port 904 to a storage location 908.

Figure 10:
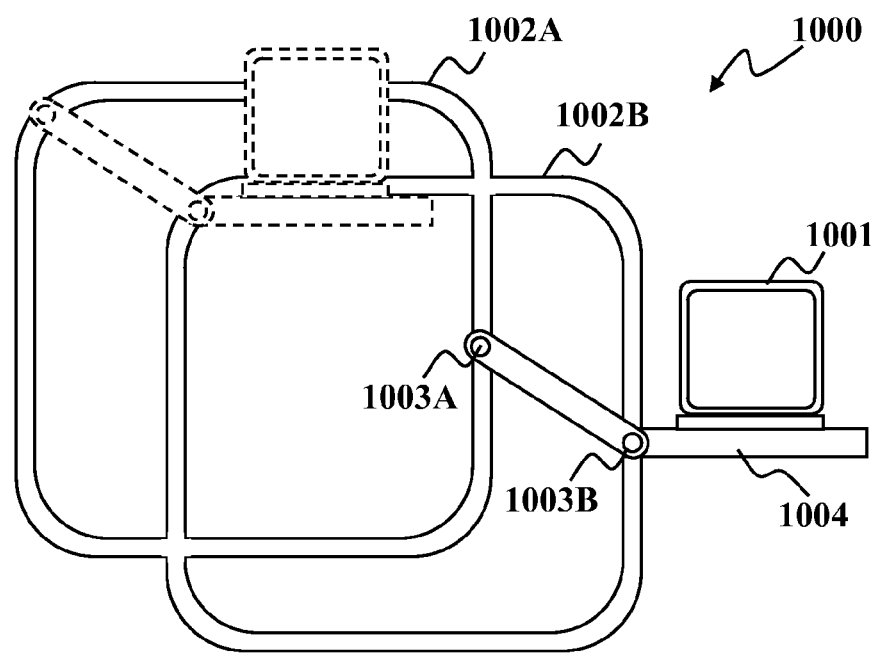
FIG. 10 is a front elevation schematic of an alternative rotating transfer mechanism.

FIG. 10 illustrates an alternative design for a rotating transfer mechanism 1000, which may be used instead of the mechanism 910 of FIG. 9. The transfer mechanism 1000 includes a pod carrier 1004 and two or more tracks, e.g., first and second tracks 1002A, 1002B. The first and second tracks 1002A, 1002B respectively follow first and second paths having substantially the same shape. In the example depicted in FIG. 10, each track is in the shape of a rectangle having rounded corners. The pod carrier 1004 includes two or more bearings 1003A, 1003B that are in a substantially fixed positional relation with respect to each other. Each bearing is adapted to ride in a different one of the first and second tracks. As shown in FIG. 10, the first and second paths are oriented substantially parallel to each other yet offset with respect to each other such that the pod carrier 1004 remains substantially level as it rides along the tracks.

Figure 11:
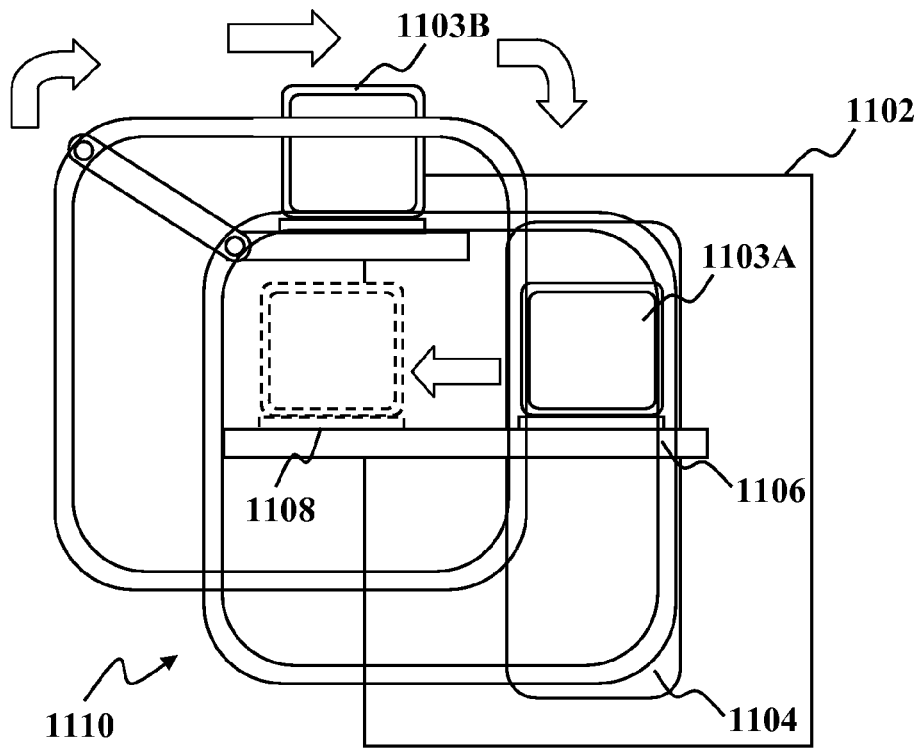
FIG. 11 is a front elevation schematic of an EFEM system with a swap buffer according to an embodiment of the present invention.

According to another alternative embodiment, transfer mechanisms may be configured to simultaneously swap a first FOUP and second FOUP between a storage location proximate the front end of the enclosure and one of the load ports. This is particularly advantageous in reducing the burden on the materials handling system. For example, an OHT car can place a new pod at the tool before the tool finishes processing another pod. If the transfer mechanism can swap the pods between the load port and storage location, an OHT car can be available for other tasks as soon as it drops off a pod. Mechanisms of the types depicted in FIGS. 9-10 are particularly useful in this context. For example, FIG. 11 depicts an EFEM system 1100 having an enclosure 1102 having a load port 1104 and a swap buffer 1100 that includes a mechanism of the type depicted in FIG. 10, e.g., having carrier that rides on bearings along first and second offset tracks. The swap buffer 1110 further includes a simple horizontal translation mechanism 1106. The swap buffer can move a first FOUP 1103A along the tracks while the horizontal translation mechanism 1106 moves a second pod 1103B underneath (or above) the first pod 1103A. In this manner, the buffer mechanism can simultaneously (or nearly simultaneously) swap the first and second pods between the load port 1104 and a storage location 1108. Although only a single load port and buffer mechanism are depicted, those of skill in the art will recognize that the system illustrated in FIG. 11 can have two or more load ports configured to work with an R-theta robot as well as two or more storage locations and swap buffers.

Figure 12:
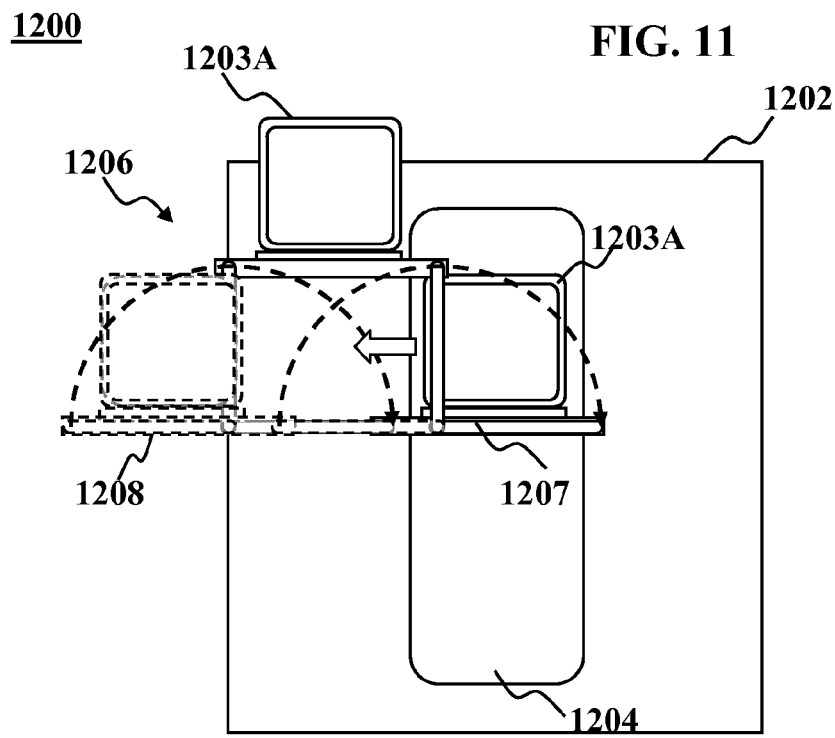
FIG. 12 is a front elevation schematic of an EFEM system with an alternative swap buffer according to an embodiment of the present invention.
Figure 13A:
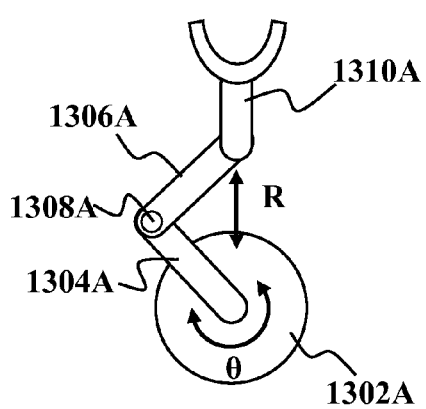
FIG. 13A is a schematic diagram of a conventional R-theta robot.
Figure 13B:
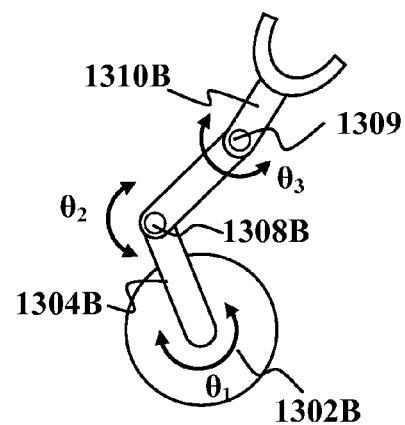
FIG. 13B is a schematic diagram of a robot having an extra degree of freedom.

As an alternative, a mechanism of the type depicted in FIG. 6 may be used to swap two pods. For example, FIG. 12 depicts an EFEM system 1200 having an enclosure 1202 having load ports 1204 and a swap buffer 1206 having a pod carrier and two or more pivot arms configured as described above with respect to FIG. 9. The swap buffer further includes a simple horizontal translation mechanism 1207 that translates a first pod 1203A between the load port 1204 and a storage location 1208. The pod carrier and pivot arms of the swap buffer rotate a second pod above (or below) the first pod so that the first and second pods can be simultaneously (or nearly simultaneously) swapped between the load port and storage location or vice versa.

Embodiments of the present invention can utilize much simpler and less expensive robots than prior art EFEM systems. R-theta robots are easier to program, more reliable and have a longer mean time between failures. These features reduce the costs of setting up and operating an EFEM system. In addition, EFEM systems according to embodiments of the present invention can have a smaller footprint, i.e., take up less space on the floor of a fab since they do not rely on a side-by-side arrangement of the load ports.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An equipment front end module (EFEM) system, comprising:
    an enclosure having two or more load ports located outside the enclosure, wherein each load port is adapted to receive a front opening unified pod (FOUP) from an automated materials handling system (AMHS), wherein each of said load ports includes a loading mechanism located outside the enclosure adjacent a wall of the enclosure, wherein the loading mechanism is configured to rotate a FOUP received from the automated materials handling system (AMHS), such that a front opening of the FOUP lines up with an opening in the wall of the enclosure, wherein said two or more load ports include first and second load ports that are arranged in a configuration other than a side-by-side configuration, and wherein a storage location is located at a corner of the enclosure between two of the load ports;
    a robot within the enclosure, wherein the robot is configured to move work pieces between the FOUP(s) and one or more work piece processing tools proximate the enclosure;
    wherein said load ports are positioned relative to said robot such that said robot can move the work pieces between said one or more work piece processing tools and a FOUP at each load port with R-theta motion or linear motion with respect to two axes while the FOUP remains outside the enclosure.

2. The system of claim 1 wherein said AMHS includes an overhead track (OHT) or automated guided vehicle (AGV), wherein said load ports are located directly under said overhead track or directly underneath a path of said AGV.

3. The system of claim 2, wherein at least one of said load ports is not located directly under said overhead track or AGV, but still being positioned such that said robot can move wafers or other work pieces to and from a FOUP(s) with an R-theta motion, said at least one load port(s) receiving FOUP(s) other than by said overhead track or AGV.

4. The apparatus of claim 1, wherein said load ports include two load ports located for access by R-theta motion of said robot and wherein said two load ports are positioned such that said AMHS can deliver said FOUPs to and retrieve said FOUPs from said two load ports.

5. The apparatus of claim 1 wherein said load ports include three load ports located for access by R-theta motion of said robot and wherein said three load ports are positioned such that said AMHS can deliver said FOUPs to and retrieve said FOUPs from said three load ports.

6. The system of claim 1 wherein said first and second load ports are adjacent corresponding openings in first and second wall sections of said enclosure, wherein said first and second wall sections are aligned non-parallel to each other.

7. The system of claim 6 wherein said first and second wall sections are aligned perpendicular to each other.

8. The system of the claim 1, further comprising at least one transfer mechanism proximate one or more of the load ports, wherein the transfer mechanism is configured to receive a FOUP from an automated material handling system at the storage location and move the FOUP to one or more of the one or more of the load ports, and/or wherein the transfer mechanism is configured to receive a FOUP from one or more of the one or more load ports and move the FOUP to the storage location.

9. The system of claim 8 wherein the transfer mechanism is adapted to move the FOUP by horizontal translation.

10. The system of claim 8 wherein the transfer mechanism is adapted to move the FOUP by vertical translation.

11. The system of claim 8 wherein the transfer mechanism is adapted to move the FOUP by rotational motion.

12. The system of claim 8 wherein the transfer mechanism is adapted to substantially simultaneously swap a first FOUP and second FOUP between the storage location and one of the load ports.

13. The system of the claim 8 wherein at least one of the load ports is disposed between two storage locations.

14. The system of claim 1 wherein said first and second load ports are adjacent corresponding openings in first and second wall sections of said EFEM, wherein first and second wall sections are located on opposite sides of said robot such that said two load ports are aligned facing each other.

15. The system of claim 1 wherein said two or more load ports include three load ports located for access by R-theta motion access of said robot.

16. The system of claim 1 wherein said two or more load ports include four load ports located for access by R-theta motion access of said robot.

17. The system of claim 1 wherein said two or more load ports include five load ports located for access by R-theta motion access of said robot.

18. The system of claim 1 further comprising at least one transfer mechanism proximate one or more of the load ports, wherein the transfer mechanism is configured to receive a FOUP from an automated material handling system at a storage location and move the FOUP to one or more of the one or more of the load ports, and/or wherein the transfer mechanism is configured to receive a FOUP from one or more of the one or more load ports and move the FOUP to the storage location.

19. The system of claim 1, wherein the enclosure includes a mini-environment, wherein the robot is located within the mini-environment.

20. The system of claim 1, further comprising a pre-aligner disposed proximate the robot.

21. A method for handling work pieces at an equipment front end module (EFEM), comprising the steps of:
    receiving a front opening unified pod (FOUP) from an automated materials handling system (AMHS) at any of two or more load ports of the EFEM located outside an enclosure of the EFEM, wherein said two or more load ports include first and second load ports that are arranged in a configuration other than a side-by-side configuration, and wherein a storage location is located at a corner of the enclosure between the first and second load ports, wherein receiving the FOUP at the EFEM includes delivering the FOUP with an overhead track or automated guided vehicle and rotating the FOUP using a loading mechanism included in one of the load ports to align the FOUP with an opening of the EFEM; and
    moving the work piece in R-theta motion between the FOUP and a work piece processing tool, while the FOUP remains outside the enclosure.

22. The method of claim 21 further comprising the step of collecting the FOUP from the EFEM.

23. The method of claim 22 wherein collecting the FOUP includes rotating the FOUP to align it with an automated material handling system.

24. The method of claim 21 wherein receiving the FOUP at the EFEM includes receiving the FOUP at any of two or more load ports of the EFEM, wherein moving the work piece includes moving the work piece in an R-theta motion relative to a fixed axis of rotation, wherein the axis of rotation is fixed with respect to the two or more load ports.

25. An apparatus for handling work pieces at an equipment front end module (EFEM), comprising:

means for receiving a front opening unified pod (FOUP) from an automated materials handling system (AMHS) at any of two or more load ports of the EFEM located outside an enclosure of the EFEM, wherein said two or more load ports include first and second load ports that are arranged in a configuration other than a side-by-side configuration, and wherein a storage location is located at a corner of the enclosure between two of the load ports;

FOUP rotating means included in one or more load ports located outside an enclosure of the EFEM for rotating the FOUP to align the FOUP with an opening in the EFEM and to rotate the FOUP to align the FOUP with an automated material handling system; and means for moving the work piece in R-theta motion between the FOUP and a work piece processing tool while the FOUP remains outside the enclosure.

* * * * *

UNITED STATES PATENT AND TRADEMARK OFFICE
CERTIFICATE OF CORRECTION

PATENT NO. : 7,604,449 B1  
APPLICATION NO. : 11/167539  
DATED : October 20, 2009  
INVENTOR(S) : Farrokh Kaveh Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 657 days.

Signed and Sealed this

Fourteenth Day of December, 2010

David J. Kappos  
*Director of the United States Patent and Trademark Office*